(12) United States Patent
Bi et al.

(10) Patent No.: US 10,424,754 B2
(45) Date of Patent: Sep. 24, 2019

(54) ORGANIC LIGHT EMITTING DIODE DEVICE, DISPLAY PANEL AND DISPLAY DEVICE

(71) Applicant: BOE TECHNOLOGY GROUP CO., LTD., Beijing (CN)

(72) Inventors: Wentao Bi, Beijing (CN); Na Li, Beijing (CN); Yinan Liang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 349 days.

(21) Appl. No.: 15/321,548

(22) PCT Filed: Mar. 9, 2016

(86) PCT No.: PCT/CN2016/075916
§ 371 (c)(1),
(2) Date: Dec. 22, 2016

(87) PCT Pub. No.: WO2016/155475
PCT Pub. Date: Oct. 6, 2016

(65) Prior Publication Data
US 2017/0213992 A1    Jul. 27, 2017

(30) Foreign Application Priority Data

Mar. 30, 2015 (CN) .......................... 2015 1 0144814

(51) Int. Cl.
*H01L 51/50* (2006.01)
*H01L 51/52* (2006.01)
*H01L 51/00* (2006.01)

(52) U.S. Cl.
CPC ...... *H01L 51/5008* (2013.01); *H01L 51/5012* (2013.01); *H01L 51/5044* (2013.01);
(Continued)

(58) Field of Classification Search
CPC ......... H01L 2251/301; H01L 2251/303; H01L 2251/308; H01L 2251/5315;
(Continued)

(56) References Cited

U.S. PATENT DOCUMENTS 6,566,807 B1 * 5/2003 Fujita .................. H01L 51/5012
313/504
7,728,517 B2 * 6/2010 Aziz .................... H01L 27/3209
257/E51.019
(Continued)

FOREIGN PATENT DOCUMENTS

CN       1728904 A      2/2006
CN     101794864 A      8/2010
(Continued)

OTHER PUBLICATIONS

Cheng et al., J. Phys. Chem. C., (2011), vol. 115, pp. 582-588. (Year: 2011).*
(Continued)

*Primary Examiner* — Dawn L Garrett
(74) *Attorney, Agent, or Firm* — Womble Bond Dickinson (US) LLP

(57) ABSTRACT

The embodiments of the present invention provide an organic light emitting diode device, display panel and display device. The existing top emitting series OLED device is improved with a structure of homojunctions; the functional layer of the top emitting series OLED device is also improved. The functional layer comprises a hole injection layer, a hole transport layer, a plurality of light emitting layers, an electron transport layer and an electron injection layer sequentially arranged from the anode. A charge generation layer A and a charge generation layer B are arranged between two directly adjacent light emitting layers. A homojunction is applied in each light emitting unit of the top emitting series OLED device, reducing the types of organic
(Continued)

materials and the carrier injection barrier, improving the injection of carriers and the efficiency of the device. The driving voltage of the device is thus reduced.

17 Claims, 5 Drawing Sheets

(52) U.S. Cl.
CPC ...... H01L 51/5056 (2013.01); H01L 51/5072 (2013.01); H01L 51/5088 (2013.01); H01L 51/5092 (2013.01); H01L 51/5218 (2013.01); H01L 51/5221 (2013.01); H01L 51/5278 (2013.01); *H01L 51/005* (2013.01); *H01L 51/0046* (2013.01); *H01L 51/0055* (2013.01); *H01L 51/0067* (2013.01); *H01L 51/0072* (2013.01); *H01L 51/0078* (2013.01); *H01L 51/0085* (2013.01); *H01L 2251/301* (2013.01); *H01L 2251/303* (2013.01); *H01L 2251/308* (2013.01); *H01L 2251/5315* (2013.01); *H01L 2251/5346* (2013.01)

(58) Field of Classification Search
CPC ......... H01L 2251/5346; H01L 51/0046; H01L 51/005; H01L 51/0055; H01L 51/0067; H01L 51/0072; H01L 51/0078; H01L 51/0085; H01L 51/5008; H01L 51/5012; H01L 51/5044; H01L 51/5056; H01L 51/5072; H01L 51/5088; H01L 51/5092; H01L 51/5218; H01L 51/5221; H01L 51/5278

See application file for complete search history.

(56) References Cited

U.S. PATENT DOCUMENTS

| | | | |
|---|---|---|---|
| 2005/0110071 A1 | 5/2005 | Ema et al. | |
| 2005/0194892 A1* | 9/2005 | Lu | H01L 51/5016 313/504 |
| 2006/0125379 A1 | 6/2006 | Liu et al. | |
| 2008/0297036 A1* | 12/2008 | Noh | C09K 11/06 313/504 |
| 2009/0001885 A1 | 1/2009 | Spindler et al. | |
| 2011/0248249 A1* | 10/2011 | Forrest | H01L 51/5016 257/40 |
| 2012/0074392 A1 | 3/2012 | Huang et al. | |
| 2012/0267619 A1* | 10/2012 | Yamada | H01L 51/5004 257/40 |
| 2013/0228769 A1* | 9/2013 | Zhou | H01L 51/5278 257/40 |
| 2014/0117337 A1* | 5/2014 | Jung | H01L 51/5044 257/40 |
| 2014/0117344 A1* | 5/2014 | Seo | H01L 51/5052 257/40 |
| 2014/0264313 A1* | 9/2014 | Schmid | C07F 1/005 257/40 |
| 2016/0293879 A1* | 10/2016 | Chen | H01L 51/5068 |
| 2016/0351809 A1* | 12/2016 | Li | H01L 51/5278 |

FOREIGN PATENT DOCUMENTS

| | | |
|---|---|---|
| CN | 201562694 U | 8/2010 |
| CN | 102027614 A | 4/2011 |
| CN | 102270747 A | 12/2011 |
| CN | 102847680 A | 12/2012 |
| CN | 104393185 A | 3/2015 |
| CN | 104701459 A | 6/2015 |

OTHER PUBLICATIONS

Cai et al. "High-Efficiency Red, Green and Blue Phosphorescent Homojunction Organic Light-Emitting Diodes based on Bipolar Host Materials." Organic Electronics 12 (2011), pp. 843-850.
Office Action in Chinese Application No. 201510144814.7 dated Jun. 2, 2016, with English translation. 10 pages.
Office Action in Chinese Application No. 201510144814.7 dated Nov. 2, 2016, with English translation. 11 pages.
International Search Report and Written Opinion in PCT/CN2016/075916 dated Jun. 15, 2016, with English translation. 16 pages.
Office Action in Chinese Application No. 201510144814.7 dated Feb. 23, 2017, with English translation. 10 pages.
Decision on Rejection in Chinese Application No. 201510144814.7 dated Jun. 2, 2017, with English translation.
Office Action received for Chinese Patent Application No. 201510144814.7, dated Mar. 15, 2018, 4 pages (1 pages of English Translation and 3 pages of Office Action).
Office Action received for Chinese Patent Application No. 201510144814.7, dated Nov. 6, 2017, 4 pages (1 page of English Translation and 3 pages of Office Action).
International Preliminary Report on Patentability received for PCT Patent Application No. PCT/CN2016/075916, dated Oct. 12, 2017, 14 pages (9 pages of English Translation and 5 pages of Original Document).

* cited by examiner

ORGANIC LIGHT EMITTING DIODE DEVICE, DISPLAY PANEL AND DISPLAY DEVICE

RELATED APPLICATIONS

The present application is the U.S. national phase entry of the international application PCT/CN2016/075916, with an international filing date of Mar. 9, 2016, which claims the benefit of Chinese Patent Application No. 201510144814.7, filed on Mar. 30, 2015, the entire disclosures of which are incorporated herein by reference.

TECHNICAL FIELD

The present invention relates to the field of display technology, in particular to an organic light emitting diode device, display panel and display device.

BACKGROUND

Organic light emitting diode (OLED) has the characteristics of low energy consumption, low driving voltage, wide color gamut, simple preparation technology, wide angle of view, fast response, and so on, which is a powerful competitor of the next generation flat panel display device, becoming a hotspot of research in recent years.

The series OLED with extensive research comprises a plurality of light emitting units. The plurality of light emitting units are connected with charge generation layers without mutually affecting their light emitting. Moreover, the current density in the device is relatively low, effectively avoiding the thermal quenching effect caused by excess current, further improving the OLED current efficiency, brightness, life and so on. By doping luminescent materials with different luminescent wavelengths, the light emitting units of the series OLED can produce red, green and blue light simultaneously; therefore, the application of the series structure in the preparation of high performance white organic electroluminescent devices is also very concerned. Moreover, considering the uneven quality of image displaying, compensation can be realized by adding transistors; the best effect can be achieved especially in the top emitting OLED devices.

However, the number of layers in the existing top emitting series OLED is too large, resulting in a high driving voltage for the device; moreover, during the injection of the carrier from the charge generation layer into the light emitting layer, the carrier can reach the light emitting layer only by overcoming the energy level difference between the electrode and injection layer, the energy level difference between the injection layer and transport layer, and the energy level difference between the transport layer and light emitting layer. Therefore, if the series OLED structure is applied into the top emitting device, it is necessary to solve the problem of high driving voltage caused by a great energy level difference. If there is a great energy level difference at the interface, the carrier cannot enter the light emitting layer easily; the carrier will thus accumulate on the interface barrier, resulting in a high driving voltage for the light emitting device, reducing efficiency.

SUMMARY

The embodiments of the present invention provide an organic light emitting diode device, display panel and display device, eliminating the problem of high barrier and high driving voltage for series OLED caused by the large number of layers in the device of the prior art.

To this end, embodiments of the present invention provide the following solutions.

An organic light emitting diode device is provided. The organic light emitting diode device comprises an anode, a functional layer and a cathode. The functional layer comprises a hole injection layer, a hole transport layer, a plurality of light emitting layers, an electron transport layer and an electron injection layer sequentially arranged from the anode. A charge generation layer A and a charge generation layer B are arranged between two directly adjacent light emitting layers; all junctions in the functional layer are homojunctions.

Optionally, along a direction from the anode to the cathode, the functional layer sequentially comprises: a hole injection layer, a hole transport layer, a light emitting layer on the anode side, a charge generation layer A, a charge generation layer B, a light emitting layer on the cathode side, an electron transport layer and an electron injection layer.

Optionally, along a direction from the anode to the cathode, the functional layer sequentially comprises: a hole injection layer, a hole transport layer, a light emitting layer on the anode side, a first charge generation layer A, a first charge generation layer B, a central light emitting layer, a second charge generation layer A, a second charge generation layer B, a light emitting layer on the cathode side, an electron transport layer and an electron injection layer.

Optionally, all layers in the functional layer are doped layers.

Optionally, the charge generation layer A and charge generation layer B in the functional layer are gradient doped layers of a single material. The doping concentration in each of the charge generation layer A and charge generation layer B gradually reduces along a direction pointing to a directly adjacent light emitting layer.

Optionally, the host materials of the charge generation layer A and charge generation layer B in the functional layer are the same organic material. The doping object materials of the charge generation layer A and charge generation layer B in the same group are different. The doping object materials are metal material, metal compound material or organic material.

Optionally, in the functional layer, any charge generation layer A is doped with a metal material. The doping concentration of the metal material gradually reduces from 5% to 0% along a direction pointing to a directly adjacent light emitting layer. The metal material comprises at least one or combination of lithium, potassium, rubidium, cesium, magnesium, calcium and sodium. Any charge generation layer B is doped with a first metal compound material. The doping concentration of the first metal compound material gradually reduces from 30% to 0% along a direction pointing to a directly adjacent light emitting layer. The first metal compound material comprises at least one or combination of molybdenum trioxide, vanadium pentoxide, tungsten trioxide, ferric chloride and ferroferric oxide.

Optionally, in the functional layer, any charge generation layer A is doped with a second metal compound material. The doping concentration of the second metal compound material gradually reduces from 15% to 0% along a direction pointing to a directly adjacent light emitting layer. The second metal compound material comprises at least one or combination of cesium carbonate, lithium fluoride, lithium carbonate, sodium chloride, ferric chloride and ferroferric oxide. Any charge generation layer B is doped with a first metal compound material. The doping concentration of the first metal compound material gradually reduces from 30% to 0% along a direction pointing to a directly adjacent light emitting layer.

Optionally, in the functional layer, any charge generation layer A is doped with a first organic material. The doping concentration of the first organic material gradually reduces from 50% to 0% along a direction pointing to a directly adjacent light emitting layer. The first organic material comprises at least one or combination of fullerene and phthalocyanine derivatives. Any charge generation layer B is doped with a second organic material. The doping concentration of the second organic material gradually reduces from 50% to 0% along a direction pointing to a directly adjacent light emitting layer. The second organic material comprises at least one or combination of pentacene, tetrafluorotetracyanoquinodimethane and phthalocyanine derivatives.

An embodiment of the present invention further provides a display panel. The display panel comprises the organic light emitting diode device according to the abovementioned embodiments.

An embodiment of the present invention further provides a display device. The display device comprises the abovementioned display panel.

In the embodiments of the present invention, the existing top emitting series OLED device is improved with a structure of homojunctions; the functional layer of the top emitting series OLED device is also improved. The functional layer comprises a hole injection layer, a hole transport layer, a plurality of light emitting layers, an electron transport layer and an electron injection layer sequentially arranged from the anode. A charge generation layer A and a charge generation layer B are arranged between two directly adjacent light emitting layers. A homojunction is applied in each light emitting unit of the top emitting series OLED device, reducing the types of organic materials and the carrier injection barrier, improving the injection of carriers and the efficiency of the device. The driving voltage of the device is thus reduced.

BRIEF DESCRIPTION OF THE DRAWINGS

In order to more clearly illustrate the technical solutions in embodiments of the invention or in the prior art, the appended drawings needed to be used in the description of the embodiments or the prior art will be introduced briefly in the following. Obviously, the drawings in the following description are only some embodiments of the invention, and for those of ordinary skills in the art, other drawings may be obtained according to these drawings under the premise of not paying out creative work.

DETAILED DESCRIPTION OF THE INVENTION

In the following, the technical solutions in embodiments of the invention will be described clearly and completely in connection with the drawings in the embodiments of the invention. Obviously, the described embodiments are only part of the embodiments of the invention, and not all of the embodiments. Based on the embodiments in the invention, all other embodiments obtained by those of ordinary skills in the art under the premise of not paying out creative work pertain to the protection scope of the invention.

The implementation of the present invention will be described below in more detail in combination with the drawings and the embodiments. The following embodiments are used for explanation of the present invention, not for limitation of the scope of the present invention.

Figure 1:
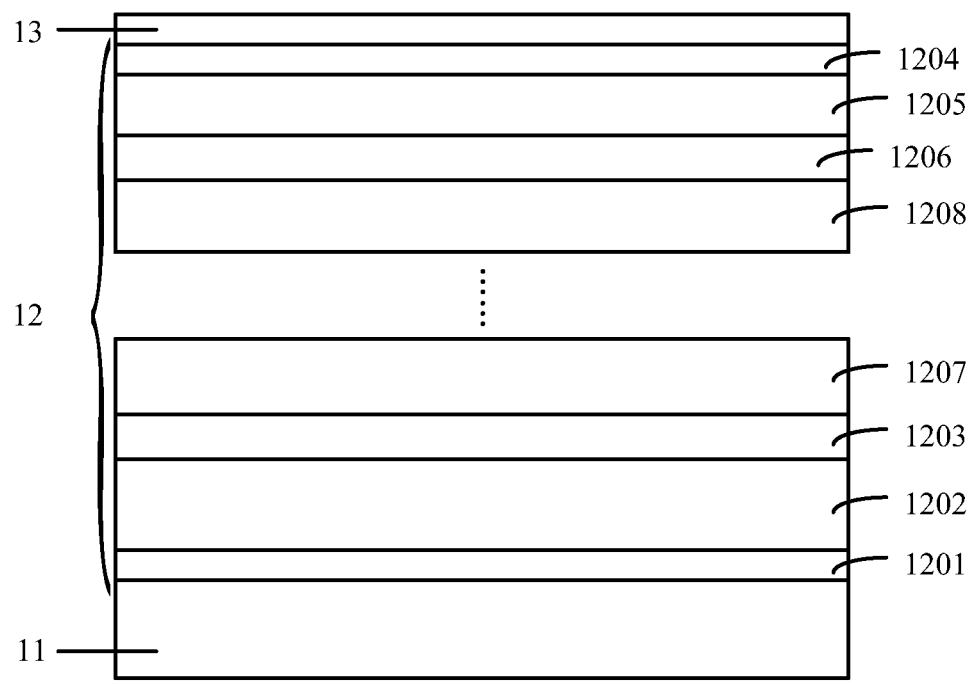
FIG. 1 is a structural schematic diagram of an organic light emitting diode device according to an embodiment of the present invention.

FIG. 1 is a structural schematic diagram of an organic light emitting diode device according to an embodiment of the present invention. As can be seen from FIG. 1, the organic light emitting diode device is a top emitting device. In particular, the organic light emitting diode device comprises an anode 11, a functional layer 12 and a cathode 13. The functional layer 12 comprises a hole injection layer 1201, a hole transport layer 1202, a plurality of light emitting layers 1203, 1206, an electron transport layer 1205 and an electron injection layer 1204 sequentially arranged from the anode 11. A charge generation layer A 1207 and a charge generation layer B 1208 are arranged between two directly adjacent light emitting layers 1203, 1206; all junctions in the functional layer 12 are homojunctions.

From the above it can be seen that in the organic light emitting diode, all layers apply homojunction structure except the anode 11 and cathode 13. The homojunction structure comprises two directly adjacent layers consisting of the same material; therefore, the injection barrier for carrier is reduced to a certain extent, improving the injection efficiency of carrier. Moreover, the series structure in the embodiment of the present invention is different from the existing technology, which directly arranges a plurality of OLED in series. In the embodiment of the present invention, only the following elements are retained: a hole injection layer, a hole transport layer and a light emitting layer on the anode side for an OLED close to the anode, an electron injection layer, an electron transport layer and a light emitting layer on the cathode side for an OLED close to the cathode. At least one group of the charge generation layer A and the charge generation layer B is applied for the connection therebetween. The following elements can be omitted: an electron injection layer, an electron transport layer and a light emitting layer on the cathode side for an OLED close to the anode, a hole injection layer, a hole transport layer and a light emitting layer on the anode side for an OLED close to the cathode, and a functional layer for each organic light emitting diode in the central portion of the series OLED device. Therefore, by connecting a plurality of OLEDs with multiple groups of the charge generation layer A and the charge generation layer B, the current efficiency, brightness, life of the OLED device are ensured; the driving voltage of the device is reduced by decreasing the thickness of layers in the series OLED device, improving the efficiency of the series OLED device.

In the embodiment of the present invention, the existing top emitting series OLED device is improved with a structure of homojunctions; the functional layer of the top emitting series OLED device is also improved. The functional layer comprises a hole injection layer, a hole transport layer, a plurality of light emitting layers, an electron transport layer and an electron injection layer sequentially arranged from the anode. A charge generation layer A and a charge generation layer B are arranged between two directly adjacent light emitting layers. A homojunction is applied in each light emitting unit of the top emitting series OLED device, reducing the types of organic materials and the carrier injection barrier, improving the injection of carriers and the efficiency of the device. The driving voltage of the device is thus reduced.

Figure 2:
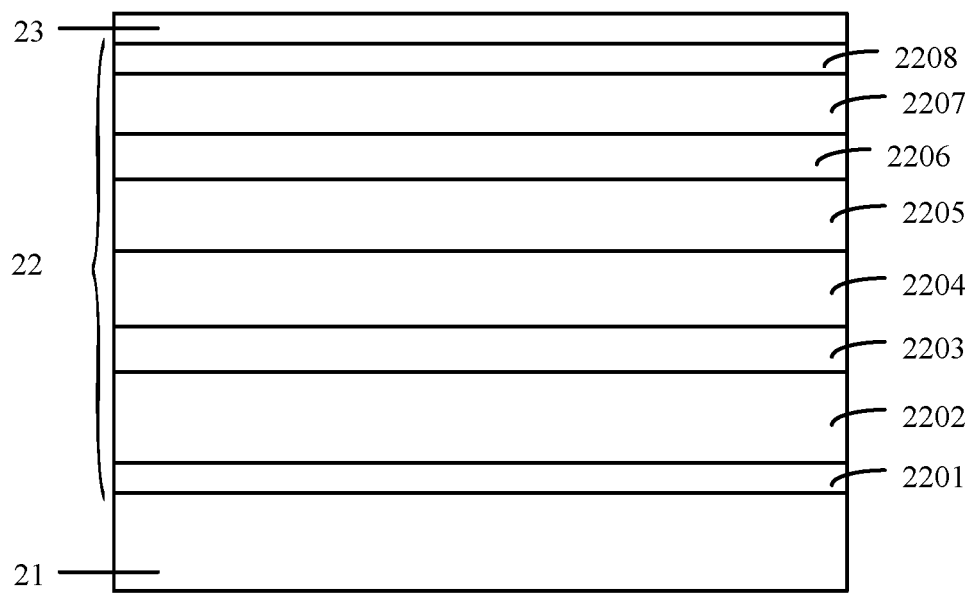
FIG. 2 is a structural schematic diagram of an OLED device with two light emitting units according to an embodiment of the present invention.

FIG. 2 shows an OLED device with two light emitting units according to an embodiment of the present invention. Optionally, the device comprises an anode 21, a functional layer 22 and a cathode 23. Along a direction from the anode 21 to the cathode 23, the functional layer 22 sequentially comprises a hole injection layer 2201, a hole transport layer 2202, a light emitting layer 2203 on the anode side, a charge generation layer A 2204, a charge generation layer B 2205, a light emitting layer 2206 on the cathode side, an electron transport layer 2207 and an electron injection layer 2208.

For the series OLED device shown in FIG. 2, on one hand, all the junctions of the device are homojunctions (i.e., the host materials of all layers are the same material); the electron migration and hole migration can be achieved by doping different materials; therefore, the carrier injection barrier between the layers is reduced to a certain extent, improving the carrier injection efficiency. On the other hand, two OLEDs arranged in series do not have complete traditional structures: the functional layers on the cathode side (e.g., electron transport layer, electron injection layer) are removed from the OLED close to the anode; the functional layers on the anode side (e.g., hole transport layer, hole injection layer) are removed from the OLED close to the cathode. Moreover, at least one group of the charge generation layer A and charge generation layer B is used for connection, thus the thickness of the layers in the series OLED device is directly reduced; this arrangement also reduces the carrier injection barrier to a certain extent, thereby reducing the driving voltage of series OLED devices.

Figure 3:
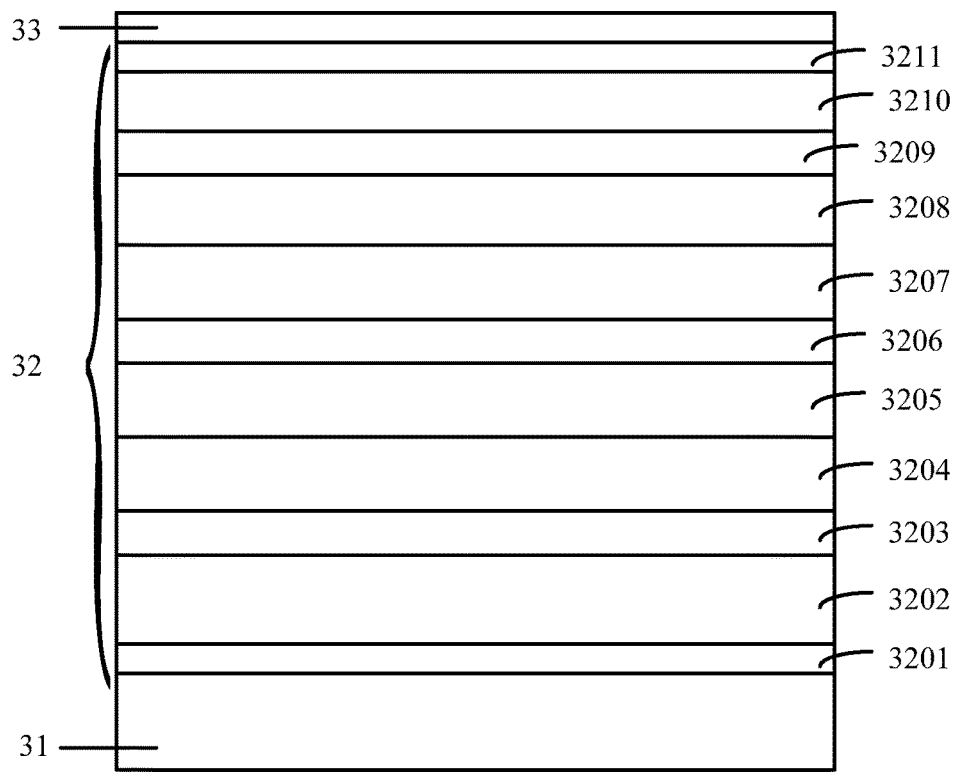
FIG. 3 is a structural schematic diagram of an OLED device with three light emitting units according to an embodiment of the present invention.

Optionally, FIG. 3 shows an OLED device with three light emitting units according to an embodiment of the present invention. FIG. 3 is only an exemplary structural schematic diagram. The embodiments of the present invention are not limited to the OLED device with three light emitting units. OLED device with more than three light emitting units can also be applied. The OLED device comprises an anode 31, a functional layer 32 and a cathode 33. Along a direction from the anode 31 to the cathode 33, the functional layer 32 sequentially comprises a hole injection layer 3201, a hole transport layer 3202, a light emitting layer 3203 on the anode side, a first charge generation layer A 3204, a first charge generation layer B 3205, a central light emitting layer 3206, a second charge generation layer A 3207, a second charge generation layer B 3208, a light emitting layer 3209 on the cathode side, an electron transport layer 3210 and an electron injection layer 3211.

Different from the arrangement of two OLED light emitting units in series shown in FIG. 2, in the series OLED device shown in FIG. 3, three OLED light emitting units are arranged in series. To reduce the thickness of the layers and ensure the carrier migration between the three series OLED light emitting units, only the light emitting layer 3206 of the central OLED light emitting unit (shown in FIG. 3) is retained. The light emitting layer 3206 is connected to the first OLED light emitting unit on the anode side with a group of charge generation layers (i.e., the first charge generation layer A 3204 and the first charge generation layer B 3205); the light emitting layer 3206 is also connected to the second OLED light emitting unit on the cathode side with another group of charge generation layers (i.e., the second charge generation layer A 3207 and the second charge generation layer B 3208). With such a connection structure, a plurality of OLED light emitting units can be arranged in series effectively. The thickness of the layers in the series OLED device is reduced; the carrier injection barrier is also reduced to a certain extent, thereby reducing the driving voltage of series OLED devices and improving the efficiency of series OLED devices.

Optionally, in a structure of series OLED device provided by an embodiment of the present invention, all the layers in the functional layer are doped layers except the hole transport layer and the electron transport layer. The hole transport layer and the electron transport layer can be either doped or undoped. The host materials of the layers in the functional layer are the same material. The doping object materials and doping concentration of the layers can be selected according to the function of the respective layer. Some detailed doping modes are introduced in the following description.

Optionally, the charge generation layer A and charge generation layer B in the functional layer are gradient doped layers of a single material; the doping concentration in each of the charge generation layer A and charge generation layer B gradually reduces along a direction pointing to a directly adjacent light emitting layer.

Optionally, the host materials of the charge generation layer A and charge generation layer B in the functional layer are the same organic material; the doping object materials of the charge generation layer A and charge generation layer B in the same group are different; the doping object materials are metal material, metal compound material or organic material.

The series OLED device in the embodiment of the present invention applies the structure of homojunctions, thus the host materials of each layer in the series OLED device are the same material. To achieve a low carrier injection barrier, the materials with comparable hole mobility and electron mobility can be considered. For example, in an electric field of 0.5MV/cm, the hole mobility and electron mobility of CBP (4,4'-bis(9-carbazolyl)-biphenyl) are respectively $2*10^{-3}$ cm$^2$/V*s and $3*10^{-4}$ cm$^2$/V*s; therefore, CPB can be used as hole transport layer material and electron transport layer material. In addition, in an electric field of 0.5MV/cm, the hole mobility and electron mobility of 46DCzPPm (4,6-bis[3-(carbazol-9-yl)phenyl] pyrimidin) are respectively $1.3*10^{-5}$ cm$^2$/V*s and $4.2*10^{-4}$ cm$^2$/V*s.

In the following, examples are introduced, in which 46DCzPPm is applied as an exemplary host material for a series OLED device of an embodiment; the doping object materials of the charge generation layer A and charge generation layer B in the same group are different.

(1) The doping object material for the charge generation layer of the homojunction structure comprises metal material.

Optionally, in the functional layer of the series OLED device, any charge generation layer A is doped with a metal material. The doping concentration of the metal material gradually reduces from 5% to 0% along a direction pointing to a directly adjacent light emitting layer. The metal material comprises at least one or combination of lithium (Li), potassium (K), rubidium (Rb), cesium (Cs), magnesium (Mg), calcium (Ca) and sodium (Na). Any charge generation layer B is doped with a first metal compound material. The doping concentration of the first metal compound material gradually reduces from 30% to 0% along a direction pointing to a directly adjacent light emitting layer. The first metal compound material comprises at least one or combination of molybdenum trioxide ($MoO_3$), vanadium pentoxide ($V_2O_5$), tungsten trioxide ($WO_3$), ferric chloride ($FeCl_3$) and ferro-ferric oxide ($Fe_3O_4$).

In this embodiment, the anode is ITO/Ag/ITO on a glass substrate, in which Ag realizes a reflective function, so the light beam emitted from the light emitting layer can be reflected and exit from the top. The cathode is made of a single metal or metal mixture.

FIG. 4(a) shows a structural schematic diagram of a series OLED device with two light emitting units according to an embodiment of the present invention. Optionally, in the embodiment, sequentially from anode to cathode, the series OLED device comprises an anode 41 (ITO/Ag/ITO on a glass substrate), a functional layer 42, and a cathode 43 made of a single metal or metal mixture (e.g., Mg or Ag).

The functional layer 42 sequentially comprises a hole injection layer 4201, a hole transport layer 4202, a light emitting layer 4203 on the anode side, a charge generation layer A 4204, a charge generation layer B 4205, a light emitting layer 4206 on the cathode side, an electron transport layer 4207 and an electron injection layer 4208. The host material for the hole injection layer 4201 is 46DCz-PPm; the doping object material for the hole injection layer 4201 is molybdenum trioxide ($MoO_3$). The host material for the hole transport layer 4202 is 46DCzPPm; the hole transport layer 4202 can be either doped or undoped. The host material for the light emitting layer 4203 on the anode side is 46DCzPPm; the light emitting layer 4203 can be either doped or undoped, and the doping object material for the light emitting layer 4203 can be selected according to the requirements for the light color. Available color types comprise red, green, blue, white, a combination of two colors, and a combination of three colors. For example, if the light emitting layer 4203 on the anode side is designed for emitting blue light, the doping object material for the light emitting layer 4203 can be FIrpic(iridium bis(4,6-di-fluoro-phenyl)-pyridinato-N,C2-picolinate). The host material for the charge generation layer A 4204 is 46DCzPPm; the doping object material for the charge generation layer A 4204 is lithium (Li); the doping concentration of Li gradually reduces from 5% to 0% along a direction pointing to a directly adjacent light emitting layer. The host material for the charge generation layer B 4205 is 46DCzPPm; the doping object material for the charge generation layer B 4205 is molybdenum trioxide ($MoO_3$); the doping concentration of $MoO_3$ gradually reduces from 30% to 0% along a direction pointing to a directly adjacent light emitting layer. The host material for the light emitting layer 4206 on the cathode side is 46DCzPPm; the light emitting layer 4206 can be either doped or undoped, and the doping object material for the light emitting layer 4206 can be the same as the doping object material for the light emitting layer 4203 on the anode side. The host material for the electron transport layer 4207 is 46DCzPPm; the electron transport layer 4207 is not doped. The host material for the electron injection layer 4208 is 46DCzPPm; the doping object material for the electron injection layer 4208 is cesium carbonate ($Cs_2CO_3$).

In the practical preparation, a first layer of ITO with a thickness of 8 nm, a layer of Ag with a thickness of 100 nm and a second layer of ITO with a thickness of 8 nm can be formed sequentially on a glass substrate, forming an ITO glass substrate. The ITO glass substrate (with a surface resistance<30Ω) for top emitting is cleaned in deionized water, acetone, and anhydrous ethanol ultrasonic environment, then the ITO glass substrate is dried with $N_2$ and processed with plasma $O_2$. The processed substrate is then arranged in an evaporation chamber. After the vacuum degree is less than $5 \times 10^{-4}$ Pa, by way of vacuum thermal evaporation, on the ITO surface, a hole injection layer 46DCzPPm:$MoO_3$ (46DCzPPm:$MoO_3$ indicates that $MoO_3$ is doped in 46DCzPPm, similarly hereinafter) with a thickness of 10 nm, a hole transport layer 46DCzPPm with a thickness of 90 nm, a light emitting layer on the anode side 46DCzPPm:FIrpic with a thickness of 20 nm, a charge generation layer A 46DCzPPm:Li with a thickness of 40 nm, a charge generation layer B 46DCzPPm:$MoO_3$ with a thickness of 40 nm, a light emitting layer on the cathode side 46DCzPPm:FIrpic with a thickness of 20 nm, an electron transport layer 46DCzPPm with a thickness of 30 nm, an electron injection layer 46DCzPPm:$Cs_2CO_3$ with a thickness of 10 nm, a cathode with a thickness of 14 nm, and a light extraction layer CPL are sequentially deposited. In the above evaporation process, the cathode is formed using a metal cathode mask plate with an evaporation rate of 0.3 nm/s, while other layers are formed using open mask plates with an evaporation rate of 0.1 nm/s. Considering the manufacture process, since homojunction structure is applied, the type of the material is reduced in the evaporation process, simplifying the process.

FIG. 4(b) shows a structural schematic diagram of a series OLED device with three light emitting units according to an embodiment of the present invention. Optionally, in the embodiment, sequentially from anode to cathode, the series OLED device comprises an anode 41' (ITO/Ag/ITO on a glass substrate), a functional layer 42', and a cathode 43' made of a single metal or metal mixture (e.g., Mg or Ag).

The functional layer 42' sequentially comprises a hole injection layer 4201', a hole transport layer 4202', a light emitting layer 4203' on the anode side, a first charge generation layer A 4204', a first charge generation layer B 4205', a central light emitting layer 4206', a second charge generation layer A 4207', a second charge generation layer B 4208', a light emitting layer 4209' on the cathode side, an electron transport layer 4210' and an electron injection layer 4211'. The host material for the hole injection layer 4201' is 46DCzPPm; the doping object material for the hole injection layer 4201' is molybdenum trioxide ($MoO_3$). The host material for the hole transport layer 4202' is 46DCzPPm; the hole transport layer 4202' can be either doped or undoped. The host material for the light emitting layer 4203' on the anode side is 46DCzPPm; the light emitting layer 4203' can be either doped or undoped, and the doping object material for the light emitting layer 4203' can be selected according to the requirements for the light color, which is similar with the light emitting layer 4203 in the abovementioned embodiment. The host material for the first charge generation layer A 4204' is 46DCzPPm; the doping object material for the first charge generation layer A 4204' is lithium (Li); the doping concentration of Li gradually reduces from 5% to 0% along a direction pointing to a directly adjacent light emitting layer. The host material for the first charge generation layer B 4205' is 46DCzPPm; the doping object material for the first charge generation layer B 4205' is molybdenum trioxide ($MoO_3$); the doping concentration of $MoO_3$ gradually reduces from 30% to 0% along a direction pointing to a directly adjacent light emitting layer. The host material for the central light emitting layer 4206' is 46DCzPPm; the doping object material for the central light emitting layer 4206' can be selected according to the requirements for the light color. The host material for the second charge generation layer A 4207' is 46DCzPPm; the doping object material for the second charge generation layer A 4207' is lithium (Li), other metal material, metal compound material or organic material; the doping concentration can be arranged based on the selection of the doping object material; the doping concentration of the doping object material should also gradually reduce along a direction pointing to a directly adjacent light emitting layer. The host material for the second charge generation layer B 4208' is 46DCzPPm; the doping object material for the second charge generation layer B 4208' is molybdenum trioxide ($MoO_3$); the selection of the doping object material for the second charge generation layer B 4208' is relatively flexible, while the doping object material for the second charge generation layer B 4208' should be different with that of the second charge generation layer A 4207'; the doping object materials in two adjacent groups of charge generation layers can be the same material; the doping concentration of the doping object material for the second charge generation layer B 4208' gradually reduces along a direction pointing to a directly adjacent light emitting layer. The host material for the light emitting layer 4209' on the cathode side is 46DCzPPm; the doping object material for the light emitting layer 4209' can be the same as the doping object material for the light emitting layer 4203' on the anode side. The host material for the electron transport layer 4210' is 46DCzPPm; the electron transport layer 4210' is not doped. The host material for the electron injection layer 4211' is 46DCzPPm; the doping object material for the electron injection layer 4211' is cesium carbonate ($Cs_2CO_3$).

The manufacture process for the series OLED device with three or more light emitting units in the embodiments of the present invention is similar with the manufacture process for the series OLED device with two light emitting units in the abovementioned embodiment, which is not repeated hereinafter.

In the abovementioned structures of series OLED devices, the charge generation layer A 4204 and the charge generation layer B 4205 form a homojunction with characteristics of PN junction; moreover, the doping concentration of each charge generation layer reduces gradually along the direction away from the homojunction.

(2) The doping object material for the charge generation layer of the homojunction structure comprises metal compound material.

Optionally, in the functional layer of the series OLED device, any charge generation layer A is doped with a second metal compound material. The doping concentration of the second metal compound material gradually reduces from 15% to 0% along a direction pointing to a directly adjacent light emitting layer. The second metal compound material comprises at least one or combination of cesium carbonate ($Cs_2CO_3$), lithium fluoride (LiF), lithium carbonate ($Li_2CO_3$), sodium chloride (NaCl), ferric chloride ($FeCl_3$) and ferroferric oxide ($Fe_3O_4$). Any charge generation layer B is doped with a first metal compound material. The doping concentration of the first metal compound material gradually reduces from 30% to 0% along a direction pointing to a directly adjacent light emitting layer.

Figure 4:
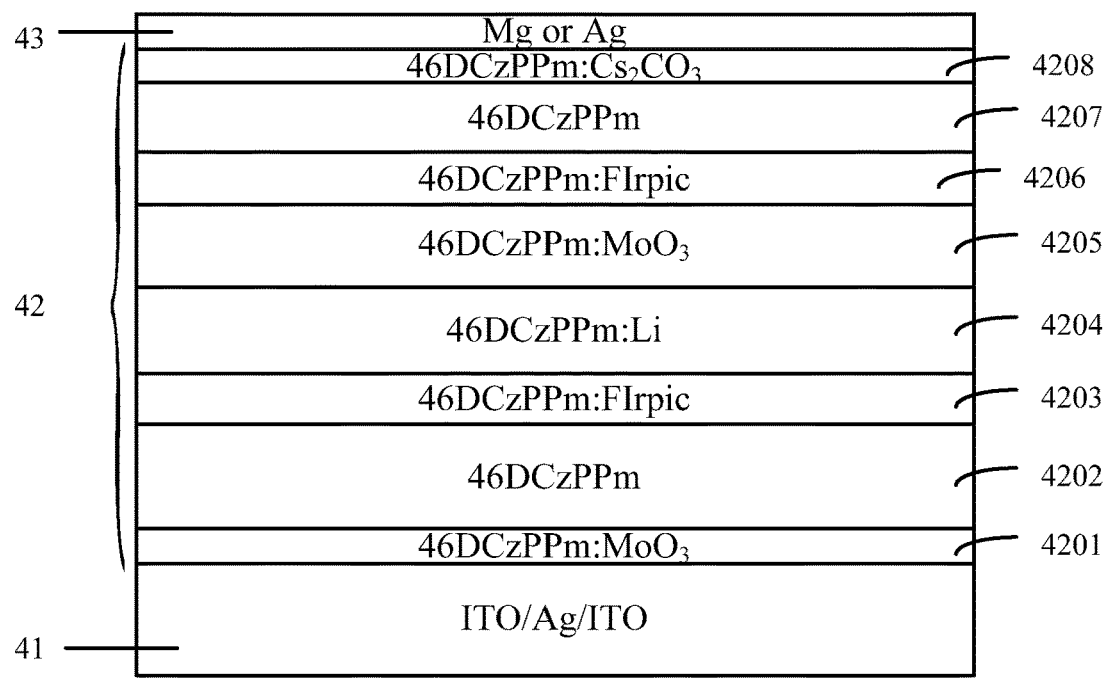
FIG. 4(a)-FIG. 4(b) are structural schematic diagrams of two types of series OLED devices according to an embodiment of the present invention, in which the doping object material for the charge generation layer of the homojunction structure comprises metal materials.
Figure 4:
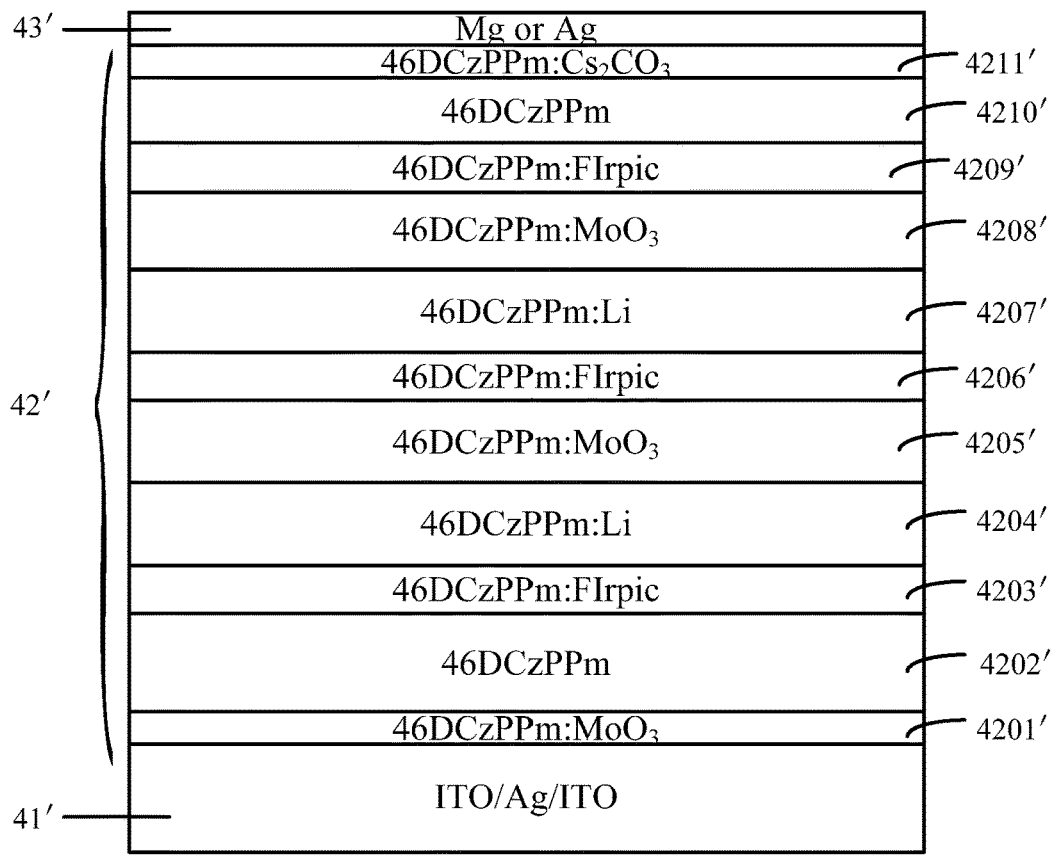
Figure 5:
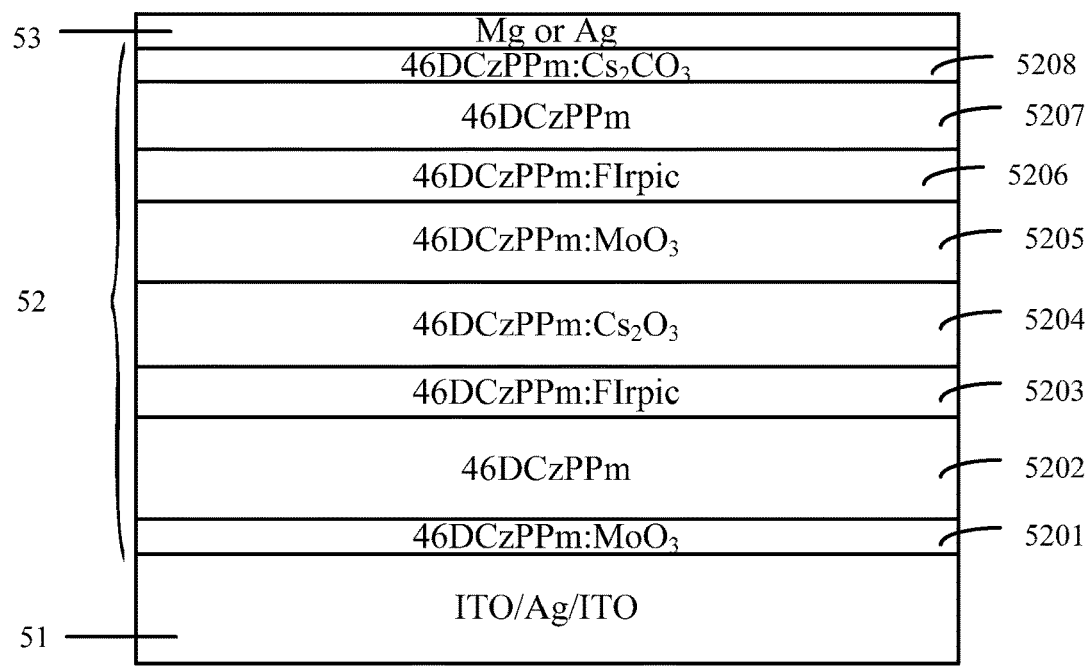
FIG. 5(a)-FIG. 5(b) are structural schematic diagrams of two types of series OLED devices according to an embodiment of the present invention, in which the doping object material for the charge generation layer of the homojunction structure comprises metal compound materials.
Figure 5:
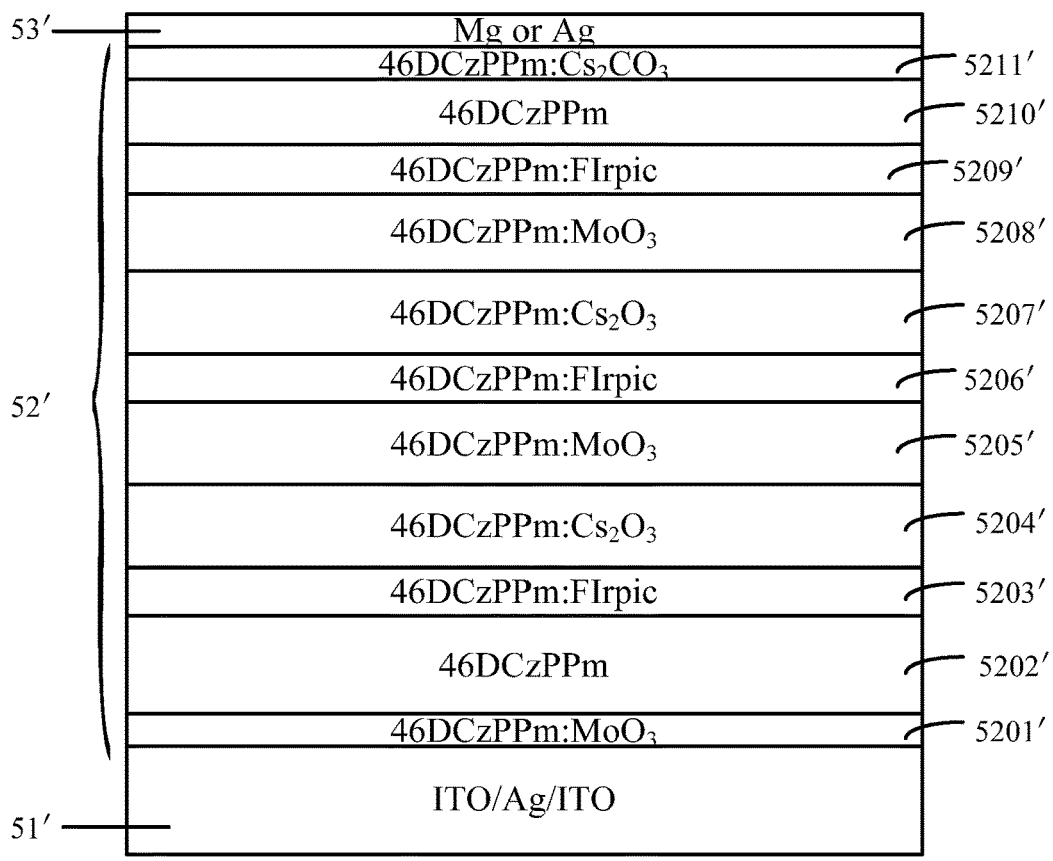

FIG. 5(*a*) shows an embodiment of a series OLED device, of which the structure is similar with the structure of the series OLED device shown in FIG. 4(*a*). In the embodiment, sequentially from anode to cathode, the series OLED device comprises an anode 51 (ITO/Ag/ITO on a glass substrate), a functional layer 52, and a cathode 53 made of a single metal or metal mixture (e.g., Mg or Ag).

The functional layer 52 sequentially comprises a hole injection layer 5201, a hole transport layer 5202, a light emitting layer 5203 on the anode side, a charge generation layer A 5204, a charge generation layer B 5205, a light emitting layer 5206 on the cathode side, an electron transport layer 5207 and an electron injection layer 5208. The only difference between these embodiments is that in the functional layer of the series OLED device shown in FIG. 5(*a*), the doping object material for the charge generation layer A 5204 is replaced with a metal compound material cesium carbonate ($Cs_2CO_3$); the doping concentration of $Cs_2CO_3$ gradually reduces from 15% to 0% along a direction pointing to a directly adjacent light emitting layer. The doping object material for the charge generation layer B 5205 is still molybdenum trioxide ($MoO_3$); the doping concentration of $MoO_3$ gradually reduces from 30% to 0% along a direction pointing to a directly adjacent light emitting layer.

FIG. 5(*b*) shows an embodiment of a series OLED device, of which the structure is similar with the structure of the series OLED device shown in FIG. 4(*b*). In the embodiment, sequentially from anode to cathode, the series OLED device comprises an anode 51' (ITO/Ag/ITO on a glass substrate), a functional layer 52', and a cathode 53' made of a single metal or metal mixture (e.g., Mg or Ag).

The functional layer 52' sequentially comprises a hole injection layer 5201', a hole transport layer 5202', a light emitting layer 5203' on the anode side, a first charge generation layer A 5204', a first charge generation layer B 5205', a central light emitting layer 5206', a second charge generation layer A 5207', a second charge generation layer B 5208', a light emitting layer 5209' on the cathode side, an electron transport layer 5210' and an electron injection layer 5211'. The only difference between these embodiments is that in the functional layer of the series OLED device shown in FIG. 5(*b*), the doping object material for the first charge generation layer A 5204' and/or the second charge generation layer A 5207' is replaced with a metal compound material cesium carbonate ($Cs_2CO_3$); the doping concentration of $Cs_2CO_3$ gradually reduces from 15% to 0% along a direction pointing to a directly adjacent light emitting layer. The doping object material for the first charge generation layer B 5205' and the second charge generation layer B 5208' is still molybdenum trioxide ($MoO_3$); the doping concentration of $MoO_3$ gradually reduces from 30% to 0% along a direction pointing to a directly adjacent light emitting layer.

In the abovementioned embodiment, a metal compound material is doped into the charge generation layer. Compared with metal material, metal compound material has high stability and high erosion resistance. Therefore, besides the effects of the abovementioned embodiment, such a series OLED device also has a long life.

(3) The doping object material for the charge generation layer of the homojunction structure comprises organic material.

Optionally, in the functional layer of the series OLED device, any charge generation layer A is doped with a first organic material. The doping concentration of the first organic material gradually reduces from 50% to 0% along a direction pointing to a directly adjacent light emitting layer. The first organic material comprises at least one or combination of fullerene ($C_{60}$) and phthalocyanine derivatives. Any charge generation layer B is doped with a second organic material. The doping concentration of the second organic material gradually reduces from 50% to 0% along a direction pointing to a directly adjacent light emitting layer. The second organic material comprises at least one or combination of pentacene, tetrafluorotetracyanoquinodimethane (F4-TCNQ) and phthalocyanine derivatives.

Figure 6:
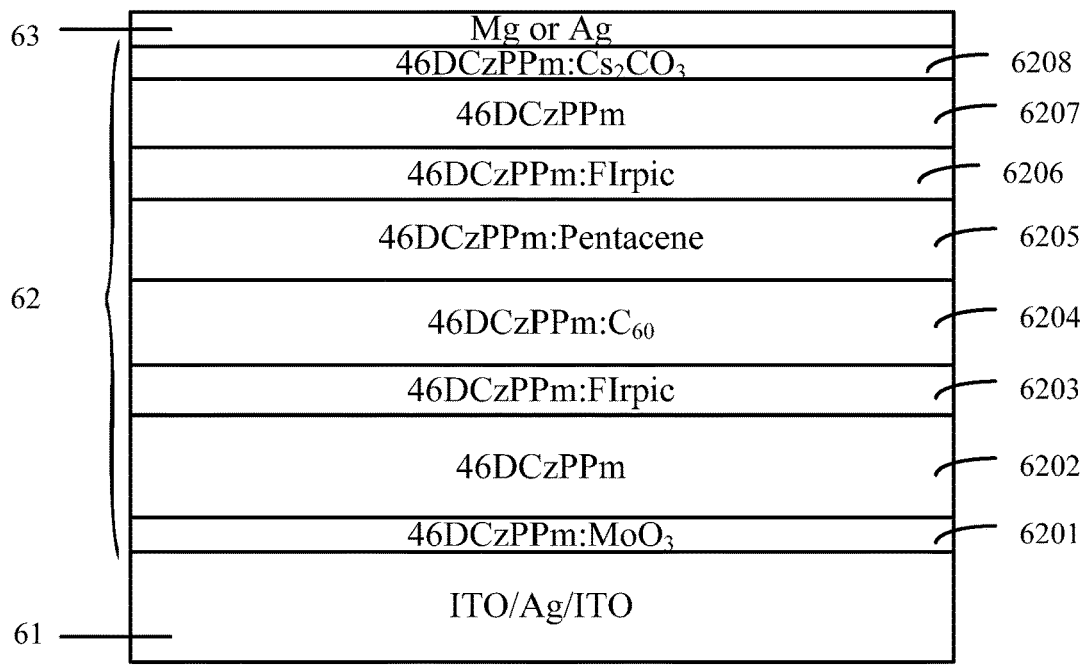
FIG. 6(a)-FIG. 6(b) are structural schematic diagrams of two types of series OLED devices according to an embodiment of the present invention, in which the doping object material for the charge generation layer of the homojunction structure comprises organic materials.
Figure 6:
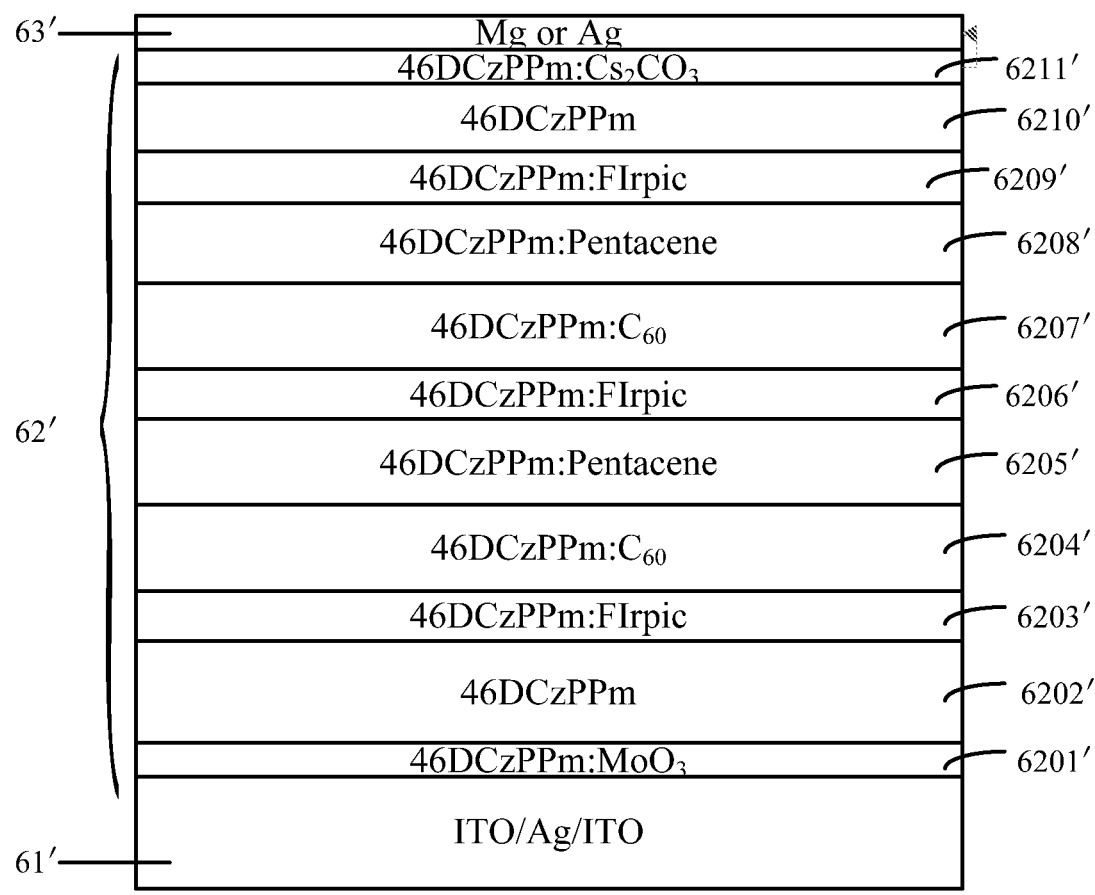

FIG. 6($a$) shows an embodiment of a series OLED device, of which the structure is similar with the structure of the series OLED device shown in FIG. 4($a$). In the embodiment, sequentially from anode to cathode, the series OLED device comprises an anode 61 (ITO/Ag/ITO on a glass substrate), a functional layer 62, and a cathode 63 made of a single metal or metal mixture (e.g., Mg or Ag).

The functional layer 62 sequentially comprises a hole injection layer 6201, a hole transport layer 6202, a light emitting layer 6203 on the anode side, a charge generation layer A 6204, a charge generation layer B 6205, a light emitting layer 6206 on the cathode side, an electron transport layer 6207 and an electron injection layer 6208. The difference between these embodiments is that in the functional layer of the series OLED device shown in FIG. 6($a$), the doping object material for the charge generation layer A 6204 is replaced with an organic material fullerene ($C_{60}$); the doping concentration of $C_{60}$ gradually reduces from 50% to 0% along a direction pointing to a directly adjacent light emitting layer; the doping object material for the charge generation layer B 6205 is pentacene ($C_{22}H_{14}$); the doping concentration of pentacene gradually reduces from 50% to 0% along a direction pointing to a directly adjacent light emitting layer.

FIG. 6($b$) shows an embodiment of a series OLED device, of which the structure is similar with the structure of the series OLED device shown in FIG. 4($b$). In the embodiment, sequentially from anode to cathode, the series OLED device comprises an anode 61' (ITO/Ag/ITO on a glass substrate), a functional layer 62', and a cathode 63' made of a single metal or metal mixture (e.g., Mg or Ag).

The functional layer 62' sequentially comprises a hole injection layer 6201', a hole transport layer 6202', a light emitting layer 6203' on the anode side, a first charge generation layer A 6204', a first charge generation layer B 6205', a central light emitting layer 6206', a second charge generation layer A 6207', a second charge generation layer B 6208', a light emitting layer 6209' on the cathode side, an electron transport layer 6210' and an electron injection layer 6211'. The difference between these embodiments is that in the functional layer of the series OLED device shown in FIG. 6($b$), the doping object material for the first charge generation layer A 6204' and/or the second charge generation layer A 6207' is replaced with a organic material (e.g., fullerene $C_{60}$); the doping concentration of fullerene gradually reduces from 15% to 0% along a direction pointing to a directly adjacent light emitting layer. The doping object material for the first charge generation layer B 6205' and the second charge generation layer B 6208' is pentacene; the doping concentration of pentacene gradually reduces from 30% to 0% along a direction pointing to a directly adjacent light emitting layer.

It should be noted that in the embodiments of the present invention, if there are at least more than two groups of the charge generation layer A and charge generation layer B, the charge generation layer A and charge generation layer B contained in respective groups may be completely same, partially same, or completely different.

In the abovementioned embodiment, an organic material is doped into the charge generation layer. Compared with metal material and metal compound material, organic material has high stability and high erosion resistance. Therefore, besides the effects of the abovementioned embodiment, such a series OLED device also has a long life.

An embodiment of the present invention further provides a display panel. The display panel comprises the organic light emitting diode device according to the abovementioned embodiments. The display panel can be used for manufacturing display device such as mobile phone, tablet computer and TV.

An embodiment of the present invention further provides a display device. The display device comprises the abovementioned display panel. Besides the structure mentioned above, the display device also comprises other necessary existing structures such as power unit, packaging substrate and packaging module. The display device can be mobile phone, tablet computer, TV and so on.

Apparently, the person skilled in the art may make various alterations and variations to the invention without departing the spirit and scope of the invention. As such, provided that these modifications and variations of the invention pertain to the scope of the claims of the invention and their equivalents, the invention is intended to embrace these alterations and variations.

What is claimed is:

1. An organic light emitting diode device comprising an anode, a functional layer and a cathode;
   wherein the functional layer comprises a hole injection layer, a hole transport layer, a plurality of light emitting layers, an electron transport layer and an electron injection layer sequentially arranged from the anode; wherein a charge generation layer A and a charge generation layer B are arranged between two directly adjacent light emitting layers;
   wherein all junctions in the functional layer are homojunctions;
   and wherein along a direction from the anode to the cathode, the functional layer sequentially comprises: a hole injection layer, a hole transport layer, a light emitting layer on the anode side, a first charge generation layer A, a first charge generation layer B, a central light emitting layer, a second charge generation layer A, a second charge generation layer B, a light emitting layer on the cathode side, an electron transport layer and an electron injection layer.

2. The organic light emitting diode device according to claim 1, wherein all layers in the functional layer are doped layers.

3. The organic light emitting diode device according to claim 2, wherein a doping concentration in each of the charge generation layer A and charge generation layer B gradually reduces along a direction pointing to a directly adjacent light emitting layer.

4. The organic light emitting diode device according to claim 1, wherein host materials of the charge generation layer A and charge generation layer B in the functional layer are the same organic material; wherein doping object materials of the charge generation layer A and charge generation layer B arranged between two directly adjacent light emitting layers are different; and wherein the doping object materials are metal material, metal compound material or organic material.

5. The organic light emitting diode device according to claim 4, wherein in the functional layer, each charge generation layer A is doped with a metal material, a doping concentration of the metal material gradually reducing from 5% to 0% along a direction pointing to a directly adjacent light emitting layer; wherein the metal material comprises at least one or combination of lithium, potassium, rubidium, cesium, magnesium, calcium and sodium;
   wherein each charge generation layer B is doped with a first metal compound material, a doping concentration of the first metal compound material gradually reducing from 30% to 0% along a direction pointing to a directly adjacent light emitting layer; and wherein the first metal compound material comprises at least one or combination of molybdenum trioxide, vanadium pentoxide, tungsten trioxide, ferric chloride and ferroferric oxide.

6. The organic light emitting diode device according to claim 4, wherein in the functional layer, each charge generation layer A is doped with a second metal compound material, a doping concentration of the second metal compound material gradually reducing from 15% to 0% along a direction pointing to a directly adjacent light emitting layer; wherein the second metal compound material comprises at least one or combination of cesium carbonate, lithium fluoride, lithium carbonate, sodium chloride, ferric chloride and ferroferric oxide;
   and wherein each charge generation layer B is doped with a first metal compound material, a doping concentration of the first metal compound material gradually reducing from 30% to 0% along a direction pointing to a directly adjacent light emitting layer.

7. The organic light emitting diode device according to claim 4, wherein in the functional layer, each charge generation layer A is doped with a first organic material, a doping concentration of the first organic material gradually reducing from 50% to 0% along a direction pointing to a directly adjacent light emitting layer; wherein the first organic material comprises at least one or combination of fullerene and phthalocyanine derivatives;
   wherein each charge generation layer B is doped with a second organic material, a doping concentration of the second organic material gradually reducing from 50% to 0% along a direction pointing to a directly adjacent light emitting layer; and wherein the second organic material comprises at least one or combination of pentacene, tetrafluorotetracyanoquinodimethane and phthalocyanine derivatives.

8. A display panel comprising the organic light emitting diode device according to claim 1.

9. The display panel according to claim 8, wherein all layers in the functional layer are doped layers.

10. The display panel according to claim 9, wherein a doping concentration in each of the charge generation layer A and charge generation layer B gradually reduces along a direction pointing to a directly adjacent light emitting layer.

11. The display panel according to claim 8, wherein host materials of the charge generation layer A and charge generation layer B in the functional layer are the same organic material; wherein doping object materials of the charge generation layer A and charge generation layer B arranged between two directly adjacent light emitting layers are different; and wherein the doping object materials are metal material, metal compound material or organic material.

12. The display panel according to claim 11, wherein in the functional layer, each charge generation layer A is doped with a metal material, a doping concentration of the metal material gradually reducing from 5% to 0% along a direction pointing to a directly adjacent light emitting layer; wherein the metal material comprises at least one or combination of lithium, potassium, rubidium, cesium, magnesium, calcium and sodium;
   wherein each charge generation layer B is doped with a first metal compound material, a doping concentration of the first metal compound material gradually reducing from 30% to 0% along a direction pointing to a directly adjacent light emitting layer; and wherein the first metal compound material comprises at least one or combination of molybdenum trioxide, vanadium pentoxide, tungsten trioxide, ferric chloride and ferroferric oxide.

13. The display panel according to claim 11, wherein in the functional layer, each charge generation layer A is doped with a second metal compound material, a doping concentration of the second metal compound material gradually reducing from 15% to 0% along a direction pointing to a directly adjacent light emitting layer; wherein the second metal compound material comprises at least one or combination of cesium carbonate, lithium fluoride, lithium carbonate, sodium chloride, ferric chloride and ferroferric oxide;
   and wherein each charge generation layer B is doped with a first metal compound material, a doping concentration of the first metal compound material gradually reducing from 30% to 0% along a direction pointing to a directly adjacent light emitting layer.

14. The display panel according to claim 11, wherein in the functional layer, each charge generation layer A is doped with a first organic material, a doping concentration of the first organic material gradually reducing from 50% to 0% along a direction pointing to a directly adjacent light emitting layer; wherein the first organic material comprises at least one or combination of fullerene and phthalocyanine derivatives;
   wherein each charge generation layer B is doped with a second organic material, a doping concentration of the second organic material gradually reducing from 50% to 0% along a direction pointing to a directly adjacent light emitting layer; and wherein the second organic material comprises at least one or combination of pentacene, tetrafluorotetracyanoquinodimethane and phthalocyanine derivatives.

15. A display device comprising the display panel according to claim 8.

16. An organic light emitting diode device comprising an anode, a functional layer and a cathode;
   wherein the functional layer comprises a hole injection layer, a hole transport layer, a plurality of light emitting layers, an electron transport layer and an electron injection layer sequentially arranged from the anode; wherein a charge generation layer A and a charge generation layer B are arranged between two directly adjacent light emitting layers;
   wherein all junctions in the functional layer are homo-junctions;
   and wherein all layers in the functional layer are doped layers.

17. A display panel comprising the organic light emitting diode device according to claim 16.

* * * * *